United States Patent
Gilmer et al.

[11] Patent Number: 5,849,643
[45] Date of Patent: Dec. 15, 1998

[54] GATE OXIDATION TECHNIQUE FOR DEEP SUB QUARTER MICRON TRANSISTORS

[75] Inventors: Mark C. Gilmer, Austin; Mark I. Gardner, Cedar Creek; Daniel Kadosh, Austin, all of Tex.

[73] Assignee: Advanced Micro Devices, Inc.

[21] Appl. No.: 862,516

[22] Filed: May 23, 1997

[51] Int. Cl.[6] .................................................. H01L 21/306
[52] U.S. Cl. ........................ 438/773; 438/773; 438/787; 438/905; 438/906; 427/534; 427/560
[58] Field of Search ..................... 438/773, 787, 438/905, 906, 403, 370; 427/534, 560

[56] References Cited

U.S. PATENT DOCUMENTS

| | | | |
|---|---|---|---|
| 5,009,926 | 4/1991 | Fukuda | 427/55 |
| 5,030,319 | 7/1991 | Nishino et al. | 156/635 |
| 5,314,780 | 5/1994 | Takei et al. | 430/128 |
| 5,635,053 | 6/1997 | Aoki et al. | 205/746 |
| 5,707,500 | 8/1991 | Shimamura et al. | 118/666 |
| 5,735,962 | 1/1996 | Hillman | 134/3 |

OTHER PUBLICATIONS

Wolf & Tauber, "Silicon Processing for the VLSI Era, vol. 1: Process Technology," 1986 Lattice Press, USA, p. 183.
Wolf, Stanley, Ph.D., "Silicon Processing for the VLSI Era, vol. 3 : The Submicron Mosfet," 1995 Lattice Press, USA, p. 438.

Primary Examiner—Charles L. Bowers, Jr.
Assistant Examiner—Thanh Nguyen
Attorney, Agent, or Firm—Kevin L. Daffer; Conley, Rose & Tayon

[57] ABSTRACT

A method of growing an oxide film in which the upper surface of a semiconductor substrate is cleaned and the semiconductor substrate is dipped into an acidic solution to remove any native oxide from the upper surface. The substrate is then directly transferred from the acidic solution to an oxidation chamber. The oxidation chamber initially contains an inert ambient maintained at a temperature of less than approximately 500° C. The transfer is accomplished without substantially exposing the substrate to oxygen thereby preventing the formation of a native oxide film on the upper surface of the substrate. Thereafter, a fluorine terminated upper surface is formed on the semiconductor substrate. The temperature within the chamber is then ramped from the first temperature to a second or oxidizing temperature if approximately 700° C. to 850° C. The presence of the fluorine terminated upper surface substantially prevents oxidation of the semiconductor substrate during the temperature ramp. A silicon-oxide film such as silicon dioxide is then grown on the fluorine terminated upper surface of the semiconductor substrate by introducing an oxidizing ambient into the chamber. After the formation or growth of the silicon-oxide, polysilicon is deposited on the silicon oxide film.

18 Claims, 1 Drawing Sheet

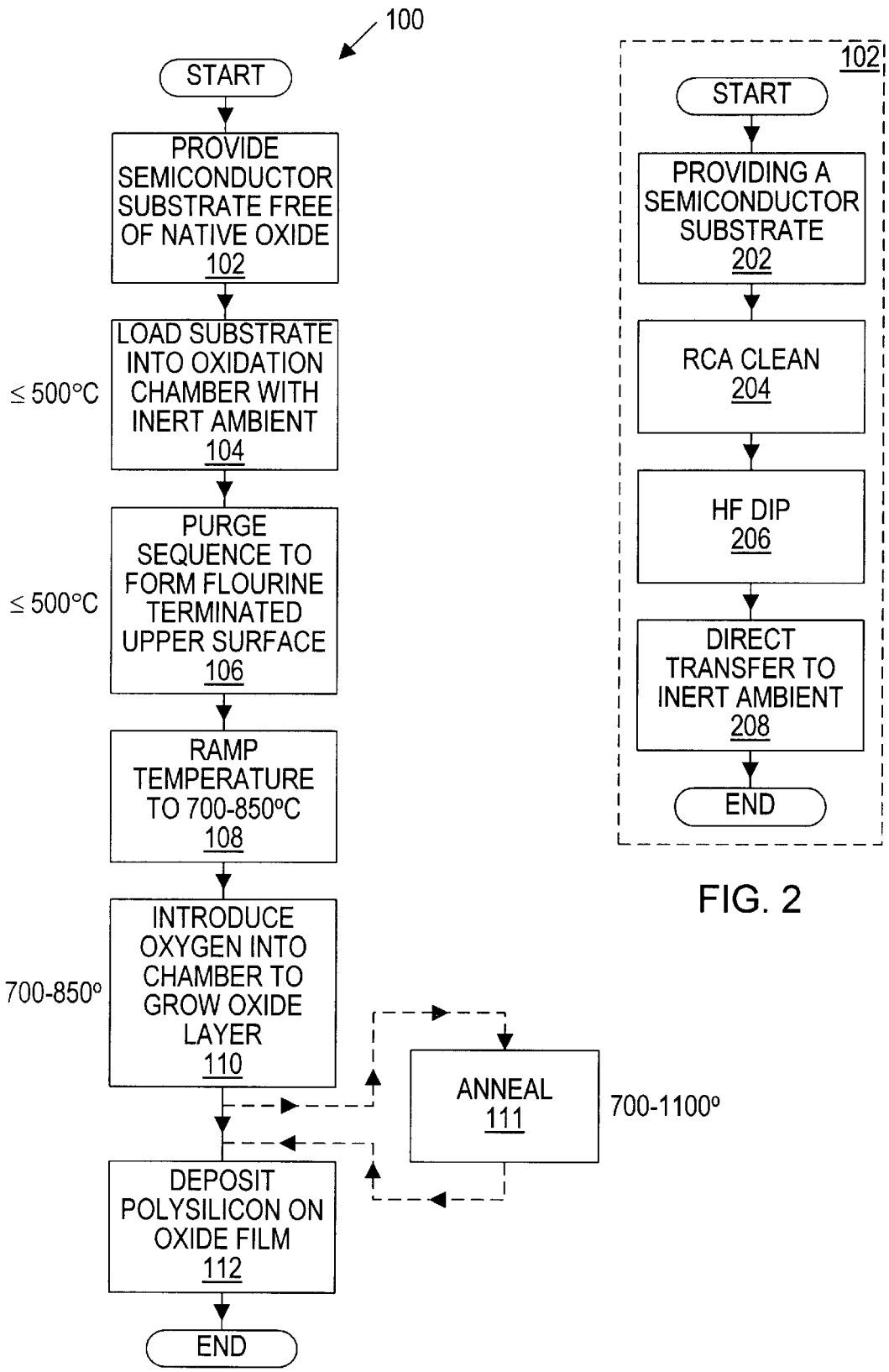

GATE OXIDATION TECHNIQUE FOR DEEP SUB QUARTER MICRON TRANSISTORS

BACKGROUND OF THE INVENTION

1. Field of the Invention

2. Description of the Relevant Art

The fabrication of MOS (metal-oxide-semiconductor) transistors within a semiconductor substrate is well known. Typically, the substrate is divided into a plurality of active and isolation regions through an isolation process such as field oxidation or shallow trench isolation. A thin oxide is then grown on an upper surface of the semiconductor substrate in the active regions. This thin oxide serves as the gate oxide for subsequently formed transistors. Next, a plurality of polysilicon gate structures are formed wherein each polysilicon gate traverses an active region effectively dividing the active region into two regions referred to as the source region and the drain region. After formation of the polysilicon gates, an implant is performed to introduce an impurity distribution into the source/drain regions.

As transistor channels shrink below 0.5 microns, the limitations of conventional transistor processing become more apparent. To combat short channel effects in deep sub-micron transistors, the depth of the source/drain junctions and the thickness of the gate oxides must be reduced. Devices become more susceptible, however, to diffusion of electrically active impurities located in the conductive gate structure across the gate oxide and into the active area of the transistor as the gate oxide thickness decreases below 50 angstroms. The presence of these impurities within the channel region can undesirably alter the threshold voltage of the device. This problem is especially acute for boron implanted gate structures. In addition, thinner oxides increase concerns about hot carrier damage and oxide breakdown due, in part, to increased electrical fields within the transistor channel and across the gate dielectric. With respect to the latter, a 3 volt bias applied across a 50 angstrom gate oxide of an MOS transistor results in an electrical field of $6 \times 10^6$ V/cm, which is considered to be an upper limit on the electrical field sustainable by a thermally formed $SiO_2$ film. See, e.g, 1 S. Wolf & R. Tauber, *Silicon Processing for the VLSI Era* 183 (Lattice Press 1986) [hereinafter "Wolf Vol. 1"]. Moreover, "cold" carrier tunneling becomes significant in gate dielectrics thinner than approximately 60 angstroms and, because of these tunneling effects, 30 angstroms has been reported as a lower limit for gate oxide thickness. See 3 S. Wolf, *Silicon Processing for the VLSI Era* 438 (Lattice Press 1995) [hereinafter "Wolf Vol. 3"].

In addition to reliability concerns, thin oxides present significant manufacturing challenges as well. The uniformity of the gate dielectric film across the wafer becomes more critical as the film thickness decreases. A 5 angstrom variation in film thickness across a wafer is far more significant in a 50 angstrom film than in a 150 angstrom film. Greater control over oxide growth rates and uniformity is needed to insure that the thinner dielectric can be consistently reproduced in a manufacturing environment.

Aside from uniformity problems, the formation of extremely thin oxide is complicated by the presence of native oxide films. Typically, a native oxide film of approximately 10 angstroms or less will form on an upper surface of a silicon substrate that is exposed to an oxygen bearing ambient such as the atmosphere in a typical wafer fabrication facility for any significant duration. Because native oxide films are formed at lower temperatures, it is theorized that the reliability of a native oxide film may be less than the reliability of a film formed at a higher temperature range (i.e., greater than 500° C.). And while the thickness of the native oxide film is typically insignificant in comparison to the thickness of thermally formed oxide found in more conventionally formed semiconductor fabrication processes, the native oxide film thickness is much more significant than the ultra thin region.

Despite the problems noted, thin gate dielectrics are desirable because the transistor drive current is inversely proportional to the gate oxide thickness over a wide range of operating conditions. Because higher drive currents result in faster devices, a great deal of effort has been directed towards reducing the gate oxide thickness (as well as other transistor geometries including channel length and junction depth) without significantly reducing the reliability of the integrated circuit.

Therefore, it would be highly desirable to fabricate ultrathin MOS gate dielectrics that exhibited resistance to penetration of mobile carriers such as boron and improved quality characteristics over conventionally formed gate dielectrics with a consistently reproducible and manufacturable process.

SUMMARY OF THE INVENTION

The problems identified above are in large part addressed by a method of growing an oxide film in which the upper surface of a semiconductor substrate is cleaned and the semiconductor substrate is dipped into an acidic solution to remove any native oxide from the upper surface. The substrate is then directly transferred from the acidic solution to an oxidation chamber. The oxidation chamber initially contains an inert ambient maintained at a temperature of less than approximately 500° C. The transfer is accomplished without substantially exposing the substrate to oxygen thereby preventing the formation of a native oxide film on the upper surface of the substrate. Thereafter, a fluorine terminated upper surface is formed on the semiconductor substrate. The temperature within the chamber is then ramped from the first temperature to a second or oxidizing temperature of approximately 700° C. to 850° C. The presence of the fluorine terminated upper surface substantially prevents significant oxidation of the semiconductor substrate during the temperature ramp. A silicon-oxide film such as silicon dioxide is then grown on the fluorine terminated upper surface of the semiconductor substrate by introducing an oxidizing ambient into the chamber. After the formation or growth of the silicon-oxide, polysilicon is deposited on the silicon oxide film.

In the preferred embodiment, the semiconductor substrate includes a p-type silicon epitaxial layer formed over a p+ silicon bulk. A resistivity of the p-type epitaxial layer is preferably in the range of approximately 10 to 15 Ω-cm. The cleaning of the upper surface of the semiconductor substrate, in the preferred embodiment, includes immersing the wafer in a first solution maintained at a temperature in the range of approximately 75° C. to 85° C. and immersing the wafer in a second solution maintained at a temperature in the range of approximately 75° C. to 85° C. The first solution preferably comprises $H_2O$, $NH_4OH$, and $H_2O_2$. The second solution preferably includes $H_2O$, HCl, and $H_2O_2$. In the preferred embodiment, the dipping of the semiconductor substrate is accomplished by immersing the semiconductor substrate into an acidic solution comprising $H_2O$ and HF in a ratio of approximately 40:1. In the presently preferred embodiment, the inert ambient comprises argon. Preferably, the formation of the fluorine terminated upper surface is accomplished by cycling the chamber ambient between a first ambient comprising an inert species and a second ambient comprising fluorine. The cycling of the chamber is accomplished while maintaining the temperature of the oxidation chamber at the first temperature. In this manner, a flourine terminated silicon upper surface is formed without any significant oxidation of the semiconductor substrate. In a preferred embodiment, the first ambient comprises argon and the second ambient includes $NF_3$. The oxidizing ambient may further include $N_2$, NO, $N_2O$, $NH_3$, $NF_3$, $O_2$ and HCl. In the preferred embodiment, the deposition of the polysilicon is performed in situ with the growth of the silicon oxide film to prevent the semiconductor substrate from being exposed to atmosphere prior the polysilicon deposition.

The present invention still further contemplates a method of growing an oxide film on an upper surface of the semiconductor substrate. The method includes providing a semiconductor substrate where an upper surface of the semiconductor substrate is substantially free of native oxide. The semiconductor substrate is then loaded into an oxidation chamber maintained at a first temperature of less than approximately 500° C. The chamber ambient is then cycled between a first ambient comprising an inert species and a second ambient comprising fluorine while maintaining the chamber at the first temperature to form a fluorine terminated upper surface of the semiconductor substrate. The temperature within the oxidation chamber is then ramped from the first temperature to a second temperature in the range of approximately 700° C. to 850° C. The fluorine terminated upper surface substantially prevents oxidation of the semiconductor substrate during the temperature ramp. Silicon oxide film is then grown on the fluorine terminated upper surface of the semiconductor substrate by introducing an oxidizing ambient into the chamber. Thereafter, polysilicon is deposited on the grown silicon-oxide film to prevent significant additional and unwanted oxidation growth.

In the preferred embodiment, the oxidation chamber comprises an inert ambient during the loading of the semiconductor substrate. The loading is preferably accomplished without exposing the semiconductor substrate to an oxidizing ambient. In this manner, the native oxide is substantially prevented from forming on the semiconductor substrate. The first ambient preferably comprises argon while the second ambient includes, in addition to flourine, nitrogen. In one embodiment, the second ambient comprises $NF_3$. In one embodiment, the deposition of the polysilicon is accomplished by thermally decomposing silane at a temperature in the range of approximately 580° C. to 650° C. The deposition of the polysilicon is preferably performed in situ with the growth of the silicon oxide film.

BRIEF DESCRIPTION OF THE DRAWINGS

Other objects and advantages of the invention will become apparent upon reading the following detailed description and upon reference to the accompanying drawings in which:

FIG. 1 is a flow diagram of a processing sequence for growing a gate dielectric according to the present invention; and FIG. 2 is a flow diagram detailing a preferred procedure for providing a semiconductor substrate free of a native oxide.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims.

DETAILED DESCRIPTION OF THE DRAWINGS

Turning now to the drawings, FIG. 1 shows a flow diagram for a processing sequence according to the present invention for growing an ultra thin (i.e., less than 50 angstroms in thickness) gate dielectric layer on an upper surface of a semiconductor substrate. The first step, shown in FIG. 1 by reference numeral 102, includes providing a semiconductor substrate. In the preferred embodiment, the semiconductor substrate comprises single crystal silicon. Still more preferably, in an application useful for the fabrication of CMOS integrated circuits, the semiconductor substrate includes a p-type epitaxial layer formed on an upper surface of a p+ silicon bulk. A resistivity of the p-type epitaxial layer is preferably in the range of approximately 10 to 15 $\Omega$-cm. The p+ silicon bulk includes an impurity distribution, typically boron, having a concentration in excess of approximately $10^{19}$ atoms/cm$^3$.

In a series of front end processing steps not shown in FIG. 1, isolation structures are formed within the semiconductor substrate and, typically, various impurity distributions are introduced into the semiconductor substrate to create localized regions of n-type and p-type impurity distributions. A common method of introducing impurity distributions into the semiconductor substrate includes ion implantation of the conventional semiconductor impurities such as boron, phosphorous, or arsenic. Transistor isolation is typically accomplished through the use of LOCOS or shallow trench isolation structures. As their name implies, isolation structures provide separation and isolation between adjacent regions within the semiconductor substrate. Isolation structures are required in semiconductor fabrication processes to prevent the inadvertent coupling of neighboring regions within the substrate. LOCOS structures are formed by thermally oxidizing selected regions of the semiconductor substrate upper surface. The selective oxidation of the semiconductor substrate is facilitated by patterning an oxidation inhibiting material such as silicon nitride on the semiconductor substrate upper surface. Shallow trench isolation structures are typically formed by etching or otherwise forming a shallow trench (i.e., less than 5000 angstroms in depth) into the semiconductor substrate and thereafter depositing a dielectric material such as a CVD oxide into the trench. For purposes of this disclosure, the processing steps prior to the formation of a gate dielectric layer are referred to as the front end processing step for ease of identification. It will be appreciated to those skilled in the art of semiconductor processing that the front end processes typically result in the formation of the n-wells and p-wells of a CMOS process, the isolation structures as previously described, and the introduction of impurity distributions for the purposes of adjusting the ultimate threshold voltages of the transistors, and selectively increasing or decreasing the net impurity distribution within localized regions of the semiconductor substrate for the purposes of, for example, increasing the field threshold voltage and the channel stop doping concentration.

It will be appreciated to those skilled in the art of semiconductor fabrication that the front end processing sequence typically results in the formation of a native oxide film on an upper surface of the semiconductor substrate. Native oxide films of 5 to 15 angstroms in thickness tend to form on whenever an exposed silicon surface comes into contact with an oxygen bearing ambient such as the atmosphere within a typical semiconductor wafer fabrication facility. In many process applications, the presence of a native oxide film prior to the formation of a gate oxide does not present a significant concern due to the relative thicknesses of the native oxide film and the subsequently formed gate oxide film. In the present invention, however, the final desired thickness of the oxide film is in the range of approximately 15 to 25 angstroms. In this range, the presence of even a thin native film prior to the thermal oxidation process is undesirable. It is theorized that, because native oxide films form at low temperatures (i.e., less than approximately 500° C. and sometimes as low as room temperature) the quality of the native oxide film as a dielectric is undesirably lower than the quality of a thermally formed film. Accordingly, one objective of the present invention is to eliminate the native oxide film from the gate dielectric.

Turning briefly to FIG. 2, a detailed view of a preferred method of providing a semiconductor substrate substantially free of a native oxide film is shown. In step 202, a semiconductor substrate such as a silicon wafer formed of a p-type epitaxial layer over a p+ silicon bulk is provided. The semiconductor substrate is subjected to a process sequence designed to clean organic, metallic, and other contaminants from the semiconductor substrate upper surface. In a presently preferred embodiment, the cleaning of the semiconductor substrate upper surface is preferably accomplished using an RCA clean. The preferred RCA clean includes a two step cleaning sequence. The semiconductor substrate is immersed in a first solution preferably maintained at a temperature in the range of approximately 75° C. to 85° C. The first solution comprises $H_2O$, $NH_4OH$, and $H_2O_2$. After immersion in the first solution, the semiconductor substrate is placed in a second solution comprising $H_2O$, HCl, and $H_2O_2$. The second solution is preferably maintained at a temperature in the range of approximately 75° C. to 85° C.

Subsequent to the RCA cleaning sequence, the semiconductor substrate is preferably immersed in an acidic solution to remove any native oxide film residing on the semiconductor substrate upper surface. The preferred acidic solution comprises $H_2O$ and HF in an approximate ratio of 40:1. The HF solution serves as an efficient wet etch solution for removing the native oxide films such as the native oxide from the substrate upper surface. To prevent the subsequent formation of another native oxide film, the present invention contemplates that the semiconductor substrate is directly transferred from the acidic solution to an inert ambient without substantially exposing the substrate upper surface to an oxidizing ambient such as the atmosphere. Ideally, the inert ambient will be contained within the oxidation chamber of an apparatus subsequently used to grow the oxide film on the substrate upper surface. As a practical matter, however, the apparatus used to grow the oxide film will not always be immediately available upon completion of the RCA clean and the HF dip. In these situations, the present invention contemplates that the direct transfer may be from the acidic solution to an inert ambient such as a wafer storage facility in which the ambient has been purged of any oxidizing agent and filled with an inert substance such as high purity argon. By storing the semiconductor substrate in an inert ambient, native oxide formation can be prevented even in those situations in which the oxidation chamber is not immediately available.

Returning now to FIG. 1, the semiconductor substrate, which is free of a native oxide film, is loaded into an oxidation chamber initially containing an inert ambient, as indicated with reference numeral 104. A suitable inert ambient includes argon. During the loading of the substrate into the oxidation chamber, the oxidation chamber is maintained at a temperature of less than approximately 500° C. and still more preferably in the room temperature range. The low temperature combined with the inert ambient substantially prevents the formation of an oxide film during the time which the semiconductor substrate is being loaded into the oxidation chamber. Referring now to reference numeral 106, a purge sequence is executed within the oxidation chamber after the semiconductor substrate has been loaded to form a fluorine terminated upper surface on the silicon substrate. In a presently preferred embodiment, the purge sequence preferred for forming the fluorine terminated upper surface is accomplished by cycling the oxidation chamber ambient between an ambient consisting essentially of argon and one consisting essentially of $NF_3$ while the temperature of the oxidation chamber is preferably maintained at the loading temperature of less than approximately 500° C.

During the intervals when the oxidation chamber ambient comprises essentially $NF_3$, the fluorine reacts with the silicon exposed at the substrate upper surface and is believed to bond with dangling silicon bonds at the substrate upper surface. The cycling of the oxidation chamber ambient between a fluorine bearing ambient and an inert ambient facilitates the fluorine bonding. As the fluorine concentration within the chamber decreases due to the consumption at the silicon surface, an inert ambient such as argon is introduced into the oxidation chamber to purge away the remaining nitrogen species. The ambient can then be replenished with a fresh supply of $NF_3$ to continue the process. The present invention contemplates that two or more cycles may be required during the formation of the fluorine terminated upper surface. The intention of incorporating fluorine at the upper surface is to substantially prevent oxidation of the silicon upper surface until a desired temperature has been reached.

Typical oxidation processes include a temperature ramp during which the oxidation chamber ambient is raised from a loading temperature to an oxidation temperature. Depending upon the oxidation equipment being used, the temperature ramp can take a significant amount of time and can begin to form a dielectric film at a temperature below a desired oxidation temperature. In an embodiment in which the thermal oxidation chamber comprises an oxidation tube, a similar occurrence of unwanted oxidation typically occurs during the push of the oxidation tube into the furnace. It is theorized that the incorporation of fluorine into the silicon upper surface substantially prevents unwanted thermal oxidation of the silicon substrate until thermal energy sufficient to release the fluorine atoms from the silicon substrate is available. The suppression of the oxidation process beneficially results in a process that produces little or no oxidation during the temperature ramp stages of the oxidation cycle.

In a presently preferred embodiment, the temperature ramp is accomplished as shown with respect to reference numeral 108 by ramping the oxidation chamber ambient from the first temperature (i.e., less than approximately 500° C.) to an oxidizing or second temperature which is most preferably in the range of approximately 700° C. to 850° C. At temperatures in the desired oxidation range, it is believed that sufficient thermal energy exists to release the flourine from the silicon surface thereby permitting a subsequent oxidation of the silicon surface. To accomplish this oxidation, an oxidizing ambient is introduced into the oxidation chamber after the temperature ramp has been completed. In the preferred embodiment, the oxidizing ambient includes oxygen in the form of NO, $N_2O$, or $O_2$. In addition to an oxygen bearing species, the oxidizing ambient may further include argon, $N_2$, $NH_3$, $NF_3$ or HCl. The presence of nitrogen during the oxidation stage is believed to beneficially incorporate nitrogen into the gate oxide film while the presence of hydrochloric acid is widely used in thermal oxidation processes to improve the oxidation rate and the quality of the oxide film. The oxidation of the silicon substrate upper surface is represented in FIG. 1 with reference numeral 110. In one embodiment, the oxidation indicated with reference numeral 110 may be followed by an anneal step during which the semiconductor substrate is raised to a temperature in the range of approximately 700° to 1100° C. in the presence of an inert ambient such as argon to densify and improve the quality of the previously formed thermal oxide film. As an optional processing step, the anneal process indicated by reference numeral 111 of FIG. 1 is indicated with dashed lines leading to and from the process block. Ideally the time, temperature, and oxidation rate of the thermal oxidation processes are carefully controlled to produce an oxide film with a thickness in the range of approximately 15 to 25 angstroms.

It will be appreciated to those skilled in the art that the gate dielectric film is essentially complete after the oxidation step of reference numeral 110 or the anneal process 111 shown in FIG. 1. It will be further appreciated, however, that to substantially prevent any subsequent and unwanted oxidation of the oxide film, it is desirable to cap the gate oxide film with a subsequent film to prevent the exposure of the gate oxide upper surface to an oxidizing ambient such as the atmosphere. Accordingly, the preferred embodiment of the present invention contemplates polysilicon deposition process upon completion of the gate oxidation or anneal process. The polysilicon deposition process in the preferred embodiment is accomplished with a thermal decomposition of silane at a temperature in the range of approximately 580° C. to 650° C. and a pressure of less than approximately 2 torr. Ideally, the polysilicon deposition process is performed in situ with the thermal oxidation process to prevent exposing the thermal oxide film to atmosphere prior to the poly deposition process. In another embodiment in which in situ thermal oxidation and polysilicon deposition is impractical or unfeasible, it is contemplated that the semiconductor substrate is transferred from the thermal oxidation equipment to the polysilicon deposition equipment directly to avoid exposure to atmosphere. Alternatively, a suitable sequence may include, for example, unloading the semiconductor substrate from the thermal oxidation process of reference numeral 110 or the anneal process of reference numeral 111 directly into a storage facility purged with an inert ambient such as argon. The semiconductor substrate may then be transported to the polysilicon deposition equipment in the storage facility to prevent undesirable oxidation.

It will be appreciated to those skilled in the art the present invention contemplates a method of forming a dielectric film with a thickness in the range of approximately 15 to 25 angstrom wherein the dielectric film consists essentially of silicon oxide formed at a temperature in excess of approximately 700° C. By substantially eliminating the negative oxide film and any oxide film formed inadvertently at lower temperatures, it is believed that the oxide film of the present invention exhibits improved quality characteristics and can be reliably and repeatedly manufactured in a production facility.

What is claimed is:

1. A method of growing an oxide, comprising:

providing a semiconductor substrate, wherein said semiconductor substrate comprises silicon;

cleaning an upper surface of said semiconductor substrate;

dipping said semiconductor substrate into an acidic solution to remove any native oxide from said upper surface;

transferring said semiconductor substrate from said acidic solution to an oxidation chamber containing an inert ambient maintained at a temperature of less than approximately 500° C., wherein said transferring occurs without substantially exposing said semiconductor substrate to oxygen to prevent a native oxide from forming on said upper surface;

forming a fluorine terminated upper surface of said semiconductor substrate;

ramping said chamber from said first temperature to a second temperature in the range of approximately 700° to 850° C. wherein said fluorine terminated upper surface substantially prevents oxidation of said semiconductor substrate during said ramping;

growing silicon-oxide on said fluorine terminated upper surface of said semiconductor substrate by introducing an oxidizing ambient into said chamber; and depositing polysilicon on said silicon-oxide film.

2. The method of claim 1, wherein said semiconductor substrate comprises a p-type silicon epitaxial layer formed over a p+ silicon bulk.

3. The method of claim 2, wherein a resistivity of said p-type epitaxial layer is in the range of approximately 10 to 15 Ω-cm.

4. The method of claim 1, wherein the step of cleaning said upper surface comprises:

immersing the wafer in a first solution comprising $H_2O$, $NH_4OH$, and $H_2O_2$ maintained at a temperature in the range of approximately 75° to 85° C.; and immersing the wafer in a second solution comprising $H_2O$, HCl, and $H_2O_2$ maintained at a temperature in the range of approximately 75° to 85° C.

5. The method of claim 1, wherein the step of dipping comprising immersing said semiconductor substrate into an acidic solution comprising $H_2O$ and HF in a ratio of approximately 40:1.

6. The method of claim 1, wherein said inert ambient comprises Argon.

7. The method of claim 1, wherein the step of forming said fluorine terminated upper surface comprises cycling a chamber ambient between a first ambient comprising an inert species and a second ambient comprising fluorine while maintaining said ambient at said first temperature to form a fluorine terminated upper surface of said semiconductor substrate.

8. The method of claim 7, wherein said first ambient comprises Argon and wherein said second ambient comprises $NF_3$.

9. The method of claim 1, wherein said oxidizing ambient comprises species selected from the group consisting of $N_2$, NO, $N_2O$, $NH_3$, $NF_3$, $O_2$, and HCl.

10. The method of claim 1, wherein the step of depositing said polysilicon is performed in situ with the step of growing said silicon-oxide thereby preventing said semiconductor substrate from being exposed to atmosphere.

11. A method of growing an oxide film on an upper surface of a semiconductor substrate;

providing a semiconductor substrate, wherein said semiconductor substrate comprises silicon and wherein an upper surface of said semiconductor substrate is substantially free of native oxide;

loading said semiconductor substrate into an oxidation chamber maintained at a first temperature of less than approximately 500° C., wherein said loading occurs without substantially exposing said semiconductor substrate to oxygen to prevent a native oxide from forming on said upper surface;

cycling said chamber ambient between a first ambient comprising an inert species and a second ambient comprising fluorine while maintaining said chamber at said first temperature to form a fluorine terminated upper surface of said semiconductor substrate;

ramping said chamber from said first temperature to a second temperature in the range of approximately 700° to 850° C., wherein said fluorine terminated upper surface substantially prevents oxidation of said semiconductor substrate during said ramping;

growing silicon-oxide on said fluorine terminated upper surface of said semiconductor substrate by introducing an oxidizing ambient into said chamber; and depositing polysilicon on said silicon-oxide film.

12. The method of claim 11, wherein said semiconductor substrate comprises a p-type epitaxial layer formed on a p+ silicon bulk and wherein a resistivity of said p-type epitaxial layer is in the range of approximately 10 to 15 $\Omega$-cm.

13. The method of claim 11, wherein said oxidation chamber comprises an inert ambient during the step of loading said semiconductor substrate and further wherein said loading is accomplished without exposing said semiconductor substrate to an oxidizing ambient, whereby native oxide is substantially prevented from forming on said semiconductor substrate.

14. The method of claim 11, wherein said first ambient comprises argon.

15. The method of claim 11, wherein said second ambient further comprises nitrogen.

16. The method of claim 15, wherein said second ambient comprises $NF_3$.

17. The method of claim 11, wherein the step of depositing said polysilicon comprises thermally decomposing silane at a temperature in the range of approximately 580° to 650° C.

18. The method of claim 17, wherein said depositing of said polysilicon is performed in situ with said growth of said silicon-oxide film.

* * * * *